(12) United States Patent
Ting et al.

(10) Patent No.: US 11,817,449 B2
(45) Date of Patent: Nov. 14, 2023

(54) MEMORY DEVICES WITH DISCHARGING CIRCUITS

(71) Applicant: Macronix International Co., Ltd., Hsinchu (TW)

(72) Inventors: Jung Chuan Ting, Hsinchu (TW); Shih-Yu Wang, Taipei (TW); Shao-Chi Chen, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 301 days.

(21) Appl. No.: 17/244,343

(22) Filed: Apr. 29, 2021

(65) Prior Publication Data

US 2022/0352146 A1    Nov. 3, 2022

(51) Int. Cl.

| | |
|---|---|
| *H01L 27/02* | (2006.01) |
| *H10B 41/27* | (2023.01) |
| *H10B 41/35* | (2023.01) |
| *H10B 41/40* | (2023.01) |
| *H10B 43/27* | (2023.01) |
| *H10B 43/35* | (2023.01) |
| *H10B 43/40* | (2023.01) |

(52) U.S. Cl.
CPC ......... *H01L 27/0292* (2013.01); *H10B 41/27* (2023.02); *H10B 41/35* (2023.02); *H10B 41/40* (2023.02); *H10B 43/27* (2023.02); *H10B 43/35* (2023.02); *H10B 43/40* (2023.02)

(58) Field of Classification Search
CPC ........ H10B 43/40; H10B 41/40; H10B 43/45; H10B 41/35; H10B 43/27; H10B 41/27; H01L 27/11573; H01L 27/11526; H01L 27/11524; H01L 27/1157; H01L 27/11582; H01L 27/11556
See application file for complete search history.

(56) References Cited

U.S. PATENT DOCUMENTS

| | | | |
|---|---|---|---|
| 4,692,785 A | * | 9/1987 | Wada ................. H01L 27/105 257/315 |
| 6,914,007 B2 | | 7/2005 | Ma et al. |
| 7,026,174 B2 | | 4/2006 | Fischer |
| | | | (Continued) |

FOREIGN PATENT DOCUMENTS

| | | |
|---|---|---|
| TW | 201931356 | 8/2019 |
| TW | 202018707 | 5/2020 |

*Primary Examiner* — Mark W Tornow
*Assistant Examiner* — David Paul Sedorook
(74) *Attorney, Agent, or Firm* — Fish & Richardson P.C.

(57) ABSTRACT

Methods, systems and apparatus for memory devices with discharging circuits are provided. In one aspect, a semiconductor device includes a semiconductor substrate, one or more discharging circuits arranged on the semiconductor substrate, one or more common source line (CSL) layers conductively coupled to the one or more discharging circuits, and a memory array having a three-dimensional (3D) array of memory cells arranged in a plurality of vertical channels on the one or more CSL layers. Each of the plurality of vertical channels includes a respective string of memory cells, and each of the one or more CSL layers is conductively coupled to corresponding strings of memory cells. Each of the one or more discharging circuits includes one or more transistors that are disabled by one or more corresponding conductive lines through the memory array.

20 Claims, 11 Drawing Sheets

(56) References Cited

U.S. PATENT DOCUMENTS

| | | |
|---|---|---|
| 9,490,249 B2 | 11/2016 | Lue et al. |
| 2006/0249755 A1 | 11/2006 | Kuo et al. |
| 2011/0303958 A1* | 12/2011 | Matsuo .................. H10B 63/00 |
| | | 257/314 |
| 2016/0005481 A1 | 1/2016 | Hung et al. |
| 2016/0204117 A1* | 7/2016 | Liu ........................ H10B 41/35 |
| | | 257/324 |
| 2017/0053923 A1 | 2/2017 | Hwang et al. |
| 2017/0221919 A1* | 8/2017 | Chung ................... H10B 43/40 |
| 2018/0109180 A1* | 4/2018 | Opris ..................... H02M 3/07 |
| 2019/0027224 A1* | 1/2019 | Choo ..................... G05F 3/262 |
| 2019/0244641 A1* | 8/2019 | Jamali ................. G11C 11/2273 |
| 2021/0091113 A1 | 3/2021 | Kim et al. |

\* cited by examiner

MEMORY DEVICES WITH DISCHARGING CIRCUITS

BACKGROUND

Memory devices, e.g., high-density NAND flash memory devices, can have various structures to increase a density of memory cells and lines on a chip. For example, three-dimensional (3D) NAND structures are attractive due to its capability to increase an array density by stacking more layers within a similar footprint. However, a common phenomenon in multi-level semiconductor devices is charge accumulation during plasma processing steps of device fabrication. One detrimental effect of the localized charge accumulation is arcing, which can damage metallization lines and destroy semiconductor components, circuits, and chips.

SUMMARY

The present disclosure describes methods, systems, and techniques for discharging circuits in memory devices, e.g., for self protection from in-process charging effects.

One aspect of the present disclosure feature a semiconductor device including: a semiconductor substrate; one or more discharging circuits arranged on the semiconductor substrate; one or more common source line (CSL) layers conductively coupled to the one or more discharging circuits; and a memory array having a three-dimensional (3D) array of memory cells arranged in a plurality of vertical channels on the one or more CSL layers, each of the plurality of vertical channels including a respective string of memory cells, each of the one or more CSL layers being conductively coupled to corresponding strings of memory cells. Each of the one or more discharging circuits includes one or more transistors that are disabled by one or more corresponding conductive lines through the memory array.

In some embodiments, the one or more transistors include: one or more p-type transistors and an n-type transistor. Gate and source terminals of each of the one or more p-type transistors are conductively coupled together by a corresponding first conductive line through the memory array to disable the p-type transistor. The n-type transistor has a gate terminal conductively coupled to a ground or a negative voltage by a second conductive line through the memory array to disable the n-type transistor.

In some embodiments, each of the one or more discharging circuits further includes a second n-type transistor having: a drain terminal conductively coupled to the gate terminal of the n-type transistor through the second conductive line, a gate terminal coupled to a positive voltage, and a source terminal coupled to the ground or the negative voltage.

In some embodiments, the one or more p-type transistors include: a plurality of p-type transistors coupled in series, the gate terminal of each of the plurality of p-type transistors being coupled to a bulk terminal of the p-type transistor, a beginning p-type transistor among the plurality of p-type transistors has a source terminal coupled to a corresponding CSL layer of the one or more CSL layers, and an ending p-type transistor among the plurality of p-type transistors has a drain terminal coupled to the gate terminal of the n-type transistor. A drain terminal of the n-type transistor is coupled to the corresponding CSL layer.

In some embodiments, a drain terminal of a first p-type transistor is coupled to a source terminal of a second p-type transistor immediately after the first p-type transistor among the plurality of p-type transistors.

In some embodiments, the source terminal and the gate terminal of each of the first and second p-type transistors are coupled together by the corresponding first conductive line.

In some embodiments, the semiconductor substrate includes an n-type well region and p-type well region, and the drain terminal of the ending p-type transistor is in the n-type well region, and the source terminal of the n-type transistor is in the p-type well region.

In some embodiments, the source and drain terminals of the plurality of p-type transistors are in the n-type well region, and the source and drain terminals of n-type transistor is in the p-type well region.

In some embodiments, the one or more discharging circuits are peripheral to the memory array on the semiconductor substrate.

In some embodiments, the semiconductor device includes an integrated circuit on the semiconductor substrate, the integrated circuit including the one or more discharging circuits, and the one more CSL layers are arranged on top of the integrated circuit.

In some embodiments, the memory array includes a plurality blocks separated by multiple filled trenches, each of the plurality of blocks being between two adjacent filled trenches and including: conductive layers separated from each other by insulating layers and vertical channels orthogonally through the conductive layers and the insulating layers. The vertical channels and the two adjacent filled trenches are coupled to a corresponding CSL layer for the block, and each page of memory cells are coupled to a respective word line, and each string of memory cells is conductively coupled to a respective bit line.

Another aspect of the present disclosure features a semiconductor device including: a semiconductor substrate; one or more discharging circuits arranged on the semiconductor substrate; one or more common source line (CSL) layers conductively coupled to the one or more discharging circuits; and a plurality of vertical channels extending through multiple layers and arranged on the one or more CSL layers, each of the one or more CSL layers being conductively coupled to corresponding vertical channels of the plurality of vertical channels. Each of the one or more discharging circuits includes a plurality of p-type transistors coupled in series to a corresponding CSL layer of the one or more CSLs, each of the plurality of p-type transistors having bulk and gate terminals that are coupled together, and an n-type transistor having a drain terminal coupled to the corresponding CSL layer. A beginning p-type transistor among the plurality of p-type transistors has a source terminal coupled to the corresponding CSL layer, and an ending p-type transistor among the plurality of p-type transistors has a drain terminal coupled to a gate terminal of the n-type transistor.

In some embodiments, the multiple layers include a plurality of alternating pairs of conductive layers and insulating layers.

In some embodiments, a source terminal and the gate terminal of each of the plurality of p-type transistors are conductively coupled by a corresponding first conductive line through the multiple layers to disable the p-type transistor. The gate terminal of the n-type transistor is conductively coupled to a ground or a negative voltage by a second conductive line through the multiple layers to disable the n-type transistor.

In some embodiments, a drain terminal of a first p-type transistor is coupled to a source terminal of a second p-type transistor immediately after the first p-type transistor among the plurality of p-type transistors.

In some embodiments, each of the one or more discharging circuits further includes a second n-type transistor having: a drain terminal conductively coupled to the gate terminal of the n-type transistor through the second conductive line; a gate terminal coupled to a positive voltage; and a source terminal coupled to the ground or the negative voltage.

In some embodiments, the semiconductor substrate includes a n-type well region and p-type well region, and the drain terminal of the ending p-type transistor is in the n-type well region, and a source terminal of the n-type transistor is in the p-type well region.

In some embodiments, the one or more discharging circuits are peripheral to the multiple layers on the semiconductor substrate.

In some embodiments, the semiconductor device includes an integrated circuit on the semiconductor substrate, the integrated circuit including the one or more discharging circuits. The one more CSLs can be arranged on top of the integrated circuit.

In some embodiments, the semiconductor device includes: a memory array having a three-dimensional (3D) array of memory cells arranged in the plurality of vertical channels, each of the plurality of vertical channels including a respective string of memory cells, each of the one or more CSL layers being conductively coupled to corresponding strings of memory cells. The memory array includes a plurality of blocks separated by multiple filled trenches, each of the plurality of blocks being between two adjacent filled trenches. The vertical channels and the two adjacent filled trenches are coupled to a corresponding CSL layer for the block, and each page of memory cells are coupled to a respective word line, and each string of memory cells is conductively coupled to a respective bit line.

Another aspect of the present disclosure features a method of forming a semiconductor device. The method includes: forming one or more discharging circuits on a semiconductor substrate, each of the one or more discharging circuit including one or more transistors; forming one or more common source line (CSL) layers conductively coupled to the one or more discharging circuits; forming a plurality of vertical channels orthogonally through multiple layers on the one or more CSL layers to be conductively coupled to the one or more CSL layers, where each of the one or more CSL layers is configured to be conductively coupled to corresponding vertical channels of the plurality of vertical channels, such that the one or more discharging circuits discharge charges generated in the corresponding vertical channels; and after forming the plurality of vertical channels, forming one or more conductive lines through the multiple layers to disable the one or more discharging circuits.

In some embodiments, the multiple layers include a plurality of alternating pairs of conductive layers and insulating layers.

In some embodiments, the one or more transistors include: multiple p-type transistors coupled in series and an n-type transistor. Bulk and gate terminals of each of the multiple p-type transistors are coupled together. A source terminal of a beginning p-type transistor among the multiple p-type transistors and a drain terminal of the n-type transistor are coupled to a corresponding CSL layer of the one or more CSL layers. A drain terminal of an ending p-type transistor among the multiple p-type transistors is coupled to a gate terminal of the n-type transistor.

In some embodiments, forming conductive lines through the multiple layers to disable the one or more discharging circuits includes: forming a corresponding first conductive line through the multiple layers to couple together the gate and source terminals of each of the multiple p-type transistors to disable the p-type transistor; and forming a second conductive line through the multiple layers to couple the n-type transistor to a ground or a negative voltage to disable the n-type transistor.

In some embodiments, each of the one or more discharging circuits includes a second n-type transistor having: a gate terminal coupled to a positive voltage, a source terminal coupled to the ground or the negative voltage, and a drain terminal. Forming the second conductive line through the multiple layers to couple the n-type transistor to the ground or the negative voltage can include: forming the second conductive line to conductively couple the drain terminal of the second n-type transistor to the gate terminal of the n-type transistor.

In some embodiments, the semiconductor substrate includes a n-type well region and p-type well region. Forming the one or more discharging circuits on the semiconductor substrate can include: forming the drain terminal of the ending p-type transistor is in the n-type well region and the source terminal of the n-type transistor is in the p-type well region.

In some embodiments, forming the one or more discharging circuits on the semiconductor substrate includes: forming each of the plurality of p-type transistors at least partially in the n-type well region, and forming the n-type transistor at least partially in the p-type well region.

Another aspect of the present disclosure features a method of forming a semiconductor device, including: forming one or more discharging circuits on a semiconductor substrate, each of the one or more discharging circuit including a plurality of p-type transistors coupled in series and an n-type transistor coupled to the plurality of p-type transistors; forming one or more common source line (CSL) layers conductively coupled to the one or more discharging circuits; and forming a plurality of vertical channels orthogonally through the multiple layers on the one or more CSL layers to be conductively coupled to the one or more CSL layers, each of the one or more CSL layers being conductively coupled to corresponding vertical channels of the plurality of vertical channels. For each of the one or more discharging circuits, bulk and gate terminals of each of the plurality of p-type transistors are coupled together, a source terminal of a beginning p-type transistor among the plurality of p-type transistors and a drain terminal of the n-type transistor are coupled to a corresponding CSL layer of the one or more CSL layers, and a drain terminal of an ending p-type transistor among the plurality of p-type transistors is coupled to a gate terminal of the n-type transistor.

In some embodiments, the semiconductor substrate includes a n-type well region and p-type well region. Forming the one or more discharging circuits on the semiconductor substrate can include: forming the drain terminal of the ending p-type transistor is in the n-type well region and the source terminal of the n-type transistor is in the p-type well region.

In some embodiments, forming the one or more discharging circuits on the semiconductor substrate includes: forming each of the plurality of p-type transistors at least partially in the n-type well region, and forming the n-type transistor at least partially in the p-type well region.

In some embodiments, the method further includes forming conductive lines to disable the one or more discharging circuits.

In some embodiments, forming conductive lines to disable the one or more discharging circuits includes: forming a corresponding first conductive line through the multiple layers to couple together the gate and source terminals of each of the plurality of p-type transistors to disable the p-type transistor; and forming a second conductive line through the multiple layers to couple the n-type transistor to a ground or a negative voltage to disable the n-type transistor.

In some embodiments, each of the one or more discharging circuits includes a second n-type transistor having: a gate terminal coupled to a positive voltage, a source terminal coupled to the ground or the negative voltage, and a drain terminal. Forming the second conductive line through the multiple layers to couple the n-type transistor to the ground or the negative voltage can include: forming the second conductive line to conductively couple the drain terminal of the second n-type transistor to the gate terminal of the n-type transistor.

The techniques implemented in the present disclosure can provide discharging circuits in memory devices, e.g., 3D NAND memory devices, for self-protection from in-process charging effects. For example, the techniques can avoid or eliminate a major challenge for vertical channel (VC) dielectric etching, e.g., wafer arcing or phase damage phenomenon, and can quickly discharge accumulated charges during manufacturing the memory devices, which can also stabilize plasma and smooth the manufacturing process. The techniques can protect metallization lines or semiconductor components, circuits and chips under 3D memory arrays or conductive common source line (CSL) layers and thereby increase yield and reliability of the memory devices. The techniques can disable functions of the discharging circuits without affecting internal circuits of the memory devices, which can minimize the effect of the existence of the discharging circuits during normal operations of the memory devices. The techniques can reduce an overall area of the discharging circuits by using n-type transistors, e.g., n-type MOS (metal-oxide-semiconductor) (or NMOS) transistors, with p-type transistors, e.g., PMOS transistors. The discharging circuits can be arranged in any suitable location in the memory devices, e.g., peripheral to the memory arrays.

The techniques implemented in the present disclosure can be applied to any device that need to remove undesired charges in the device, e.g., during fabricating and/or operating the device. The techniques implemented in the present disclosure can be applied to various memory types, such as SLC (single-level cell) devices, MLC (multi-level cell) devices like 2-level cell devices, TLC (triple-level cell) devices, or QLC (quad-level cell) devices. The techniques can be applied to various dimensions of memory systems, such as three-dimensional (3D) memory systems. The techniques can be applied to various types of non-volatile memory systems, such as Mask Read-Only Memory, Programmable Read-Only Memory, Erasable Programmable Read-Only Memory, Electrically Erasable Programmable Read-Only Memory, and Flash Memory. The flash memory can include NAND flash memory, NOR flash memory, among others. Additionally or alternatively, the techniques can be applied to various types of devices and systems, such as secure digital (SD) cards, embedded multimedia cards (eMMC), or solid-state drives (SSDs), embedded systems, media players, mobile devices, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
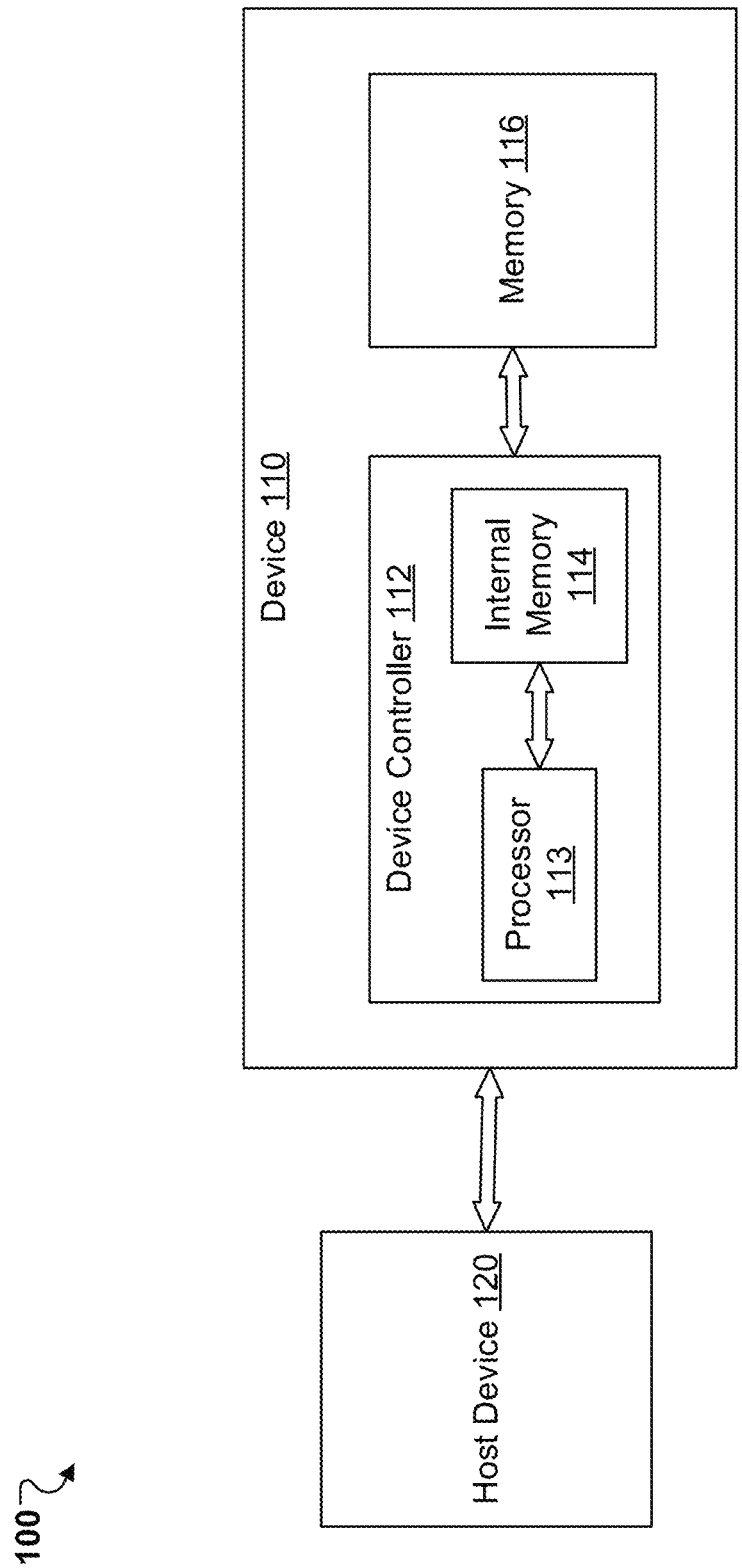
FIG. 1A illustrates an example of a system including a memory device according to one or more embodiments of the present disclosure.

FIG. 1A illustrates an example of a system 100 for erasing and/or programming data. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

The memory 116 includes a memory array having a plurality of blocks. The memory 116 can be a two-dimensional (2D) memory or a three-dimensional (3D) memory, and accordingly each corresponding block can be a 2D block or a 3D block.

Figure 1B:
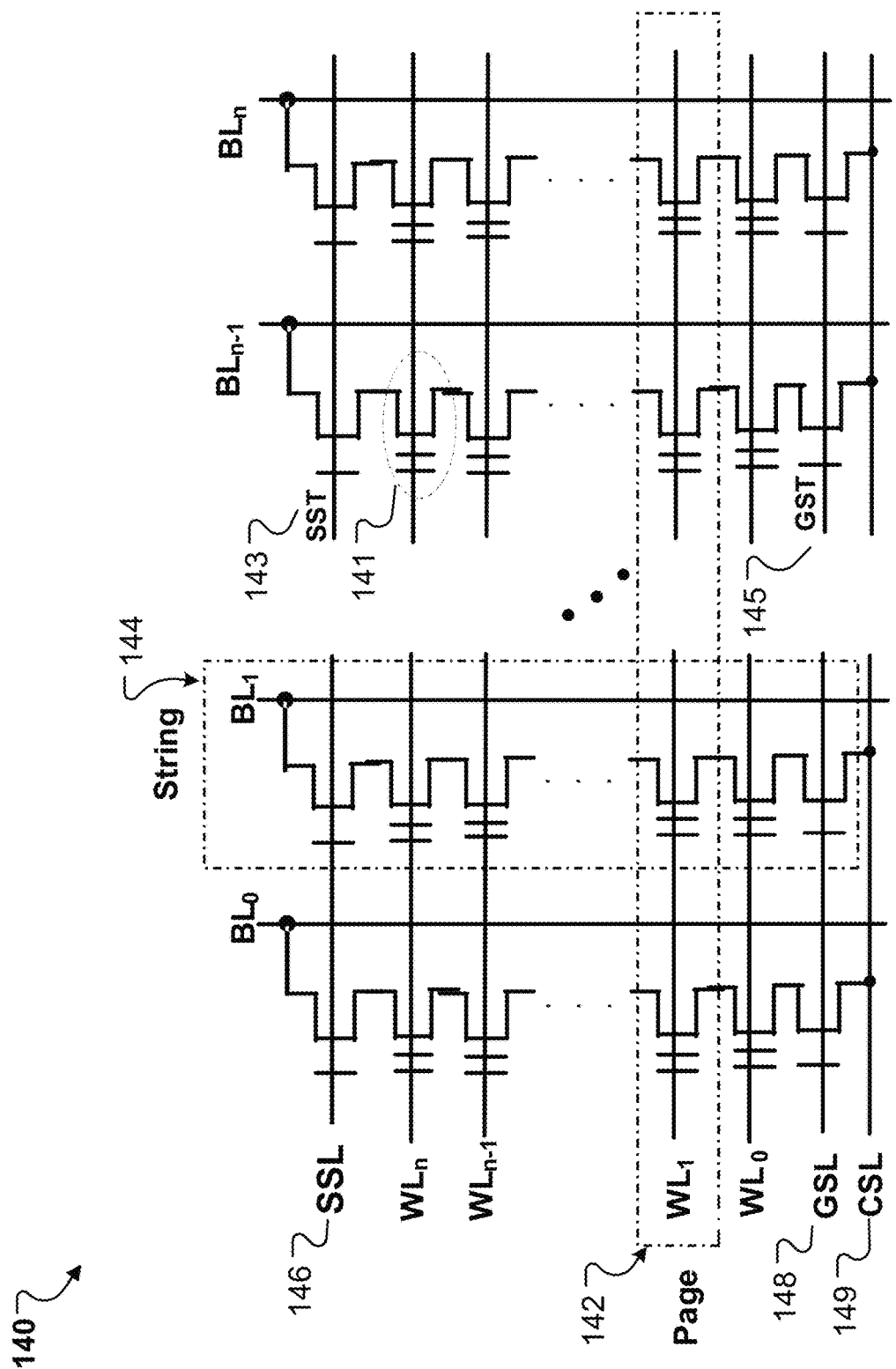
FIG. 1B illustrates an example block of a two-dimensional (2D) memory according to one or more embodiments of the present disclosure.

FIG. 1B illustrates an example configuration of a 2D memory block 140 when the memory 116 is a 2D memory. The block 140 includes memory cells 141 coupled in series to column bit lines $BL_0, BL_1, \ldots, BL_{n-1}$, and $BL_n$ to form a number of cell strings 144, and to row word lines $WL_0$, $WL_1, \ldots, WL_{n-1}$, and $WL_n$ to form a number of cell pages 142.

Each memory cell in a block includes a transistor structure having a gate, a drain, a source, and a bulk defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are connected in series. A gate of the SST 143 is connected to a string select line (SSL) 146. Gates of the SSTs in different strings are also connected to the same SSL. Gates of the memory cells 141 are respectively connected to word lines $WL_0, WL_1, \ldots, WL_{n-1}, WL_n$. The cell strings 144 or the memory cells 141 are connected to a common source line (CSL) 149 via the GST 145. The CSL 149 can be coupled to a ground. A gate of the GST 145 is connected to a ground select line (GSL) 148. Gates of the GSTs in different strings are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

The device 110 can include a Flash Translation Layer (FTL) to manage read, write, and erase operations. The FTL can be stored in the device controller 112, e.g., in the internal memory 114. The FTL uses a logical-to-physical (L2P) address mapping table storing mapping from logical pages in a logical block to physical pages in a physical block.

Figure 1C:
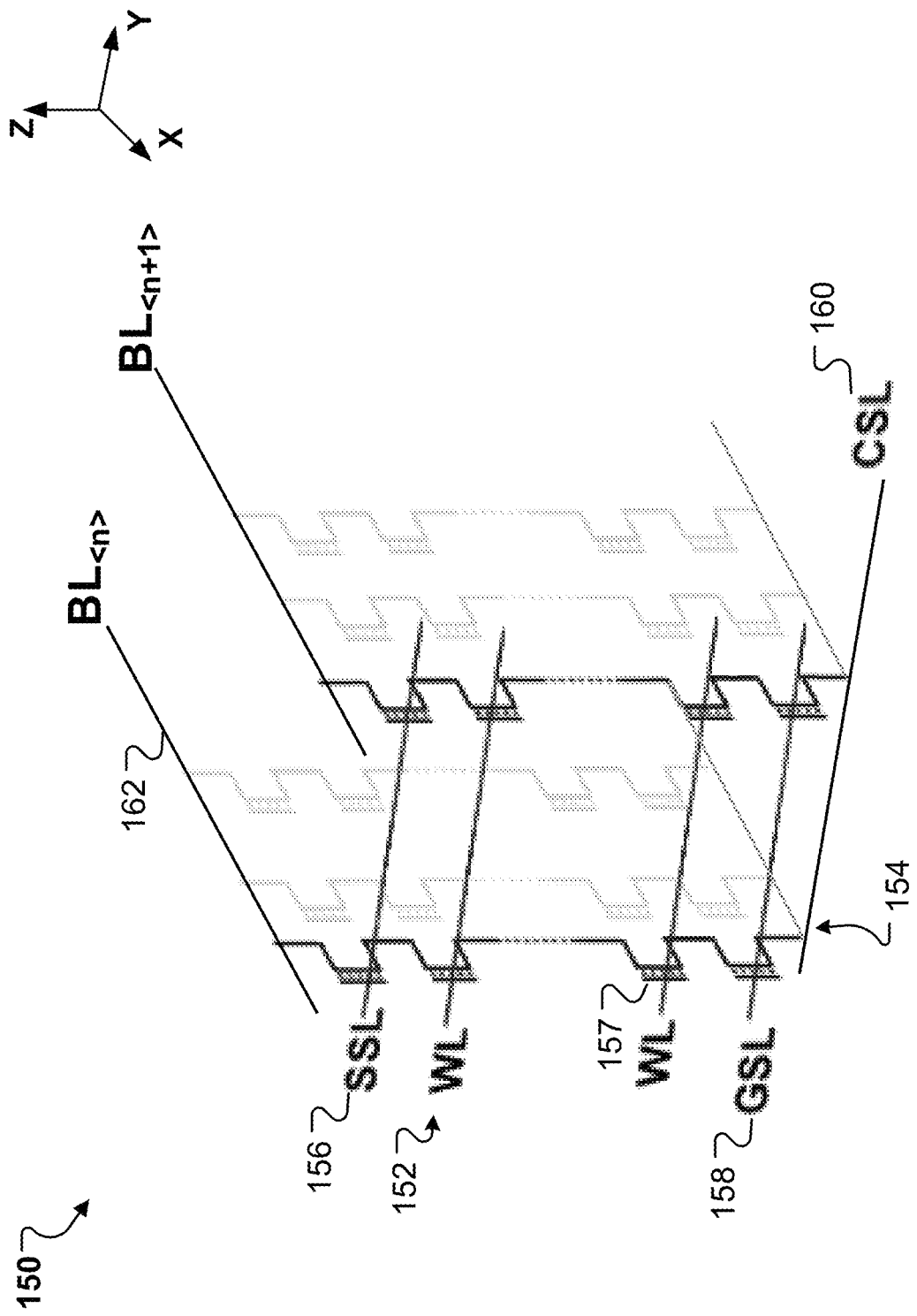
FIG. 1C illustrates an example block of a three-dimensional (3D) memory according to one or more embodiments of the present disclosure.

FIG. 1C illustrates an example 3D memory block 150 when the memory 116 is a 3D memory. Memory cells 157 are arranged in three dimensions, e.g., in an XYZ coordinate system, and coupled to a number of word lines to form a number of cell pages 152 and a number of bit lines to form a number of cell strings 154.

A cell page 152 can be a layer, e.g., in the XY plane, and memory cells 157 on the same layer can be coupled to one word line and have a same voltage. A cell string 154 includes a number of memory cells 157 connected in series vertically along the Z direction in a vertical channel (VC). In the cell string 154, a memory cell can be configured as an SST coupled to a string select line (SSL) 156 and a memory cell can be configured as a GST coupled to a ground select line (GSL) 158. The cell strings 154 of the memory cells 157 are connected to a common source line (CSL) 160 via the GSTs. The CSL 160 can be a conductive layer formed on a substrate of the 3D memory. The CSL 160 can be coupled to the ground.

A 3D memory block can be defined between two adjacent filled trenches (e.g., along the Z direction). The adjacent filled trenches can be conductively coupled to a common source line (CSL) layer formed on the substrate. The CSL layer can be made of any one of polysilicon, epitaxial (Epi), or metal (e.g., tungsten W). In some cases, the adjacent filled trenches and the CSL layer together are together considered as CSLs.

To form the 3D array of memory cells on a substrate such as a wafer, a plurality of vertical channels (VCs) can be first formed through multiple layers along the vertical direction (e.g., the Z direction). The VCs can include high aspect ratio holes, which can be formed by anisotropic etching, e.g., reactive ion etching (RIE) or plasma etching. However, wafer arcing or plasma damage phenomena can occur during the etching process. Charges, e.g., ions and/or electrons, during plasma processing can accumulate to form a voltage, e.g., a horizontal direct current (DC) voltage on the wafer, which can cause plasma instability or wafer arcing. The arcing damage can occur near metallization lines and underlying and/or surrounding regions under common source line (CSL) layers on the wafer. The arcing can not only damage circuits and/or chips already formed on the wafer but also make further processing impractical. As a result, the arcing damage to the wafer can be costly in terms of wafer yield and reliability.

Implementations of the present disclosure provide methods and techniques to avoid the above wafer arcing or plasma damage problems for vertical channel (VC) etching in forming a 3D memory on a substrate. In some implementations, one or more discharging circuits are conductively coupled to a CSL layer on a boundary or peripheral areas of the 3D memory, e.g., as described with further details in FIGS. 2A-2B, such that charges accumulated during processing can be quickly removed or discharged from the VCs to doped regions in the substrate, e.g., as described with further details in FIGS. 3A-3C.

Figure 4A:
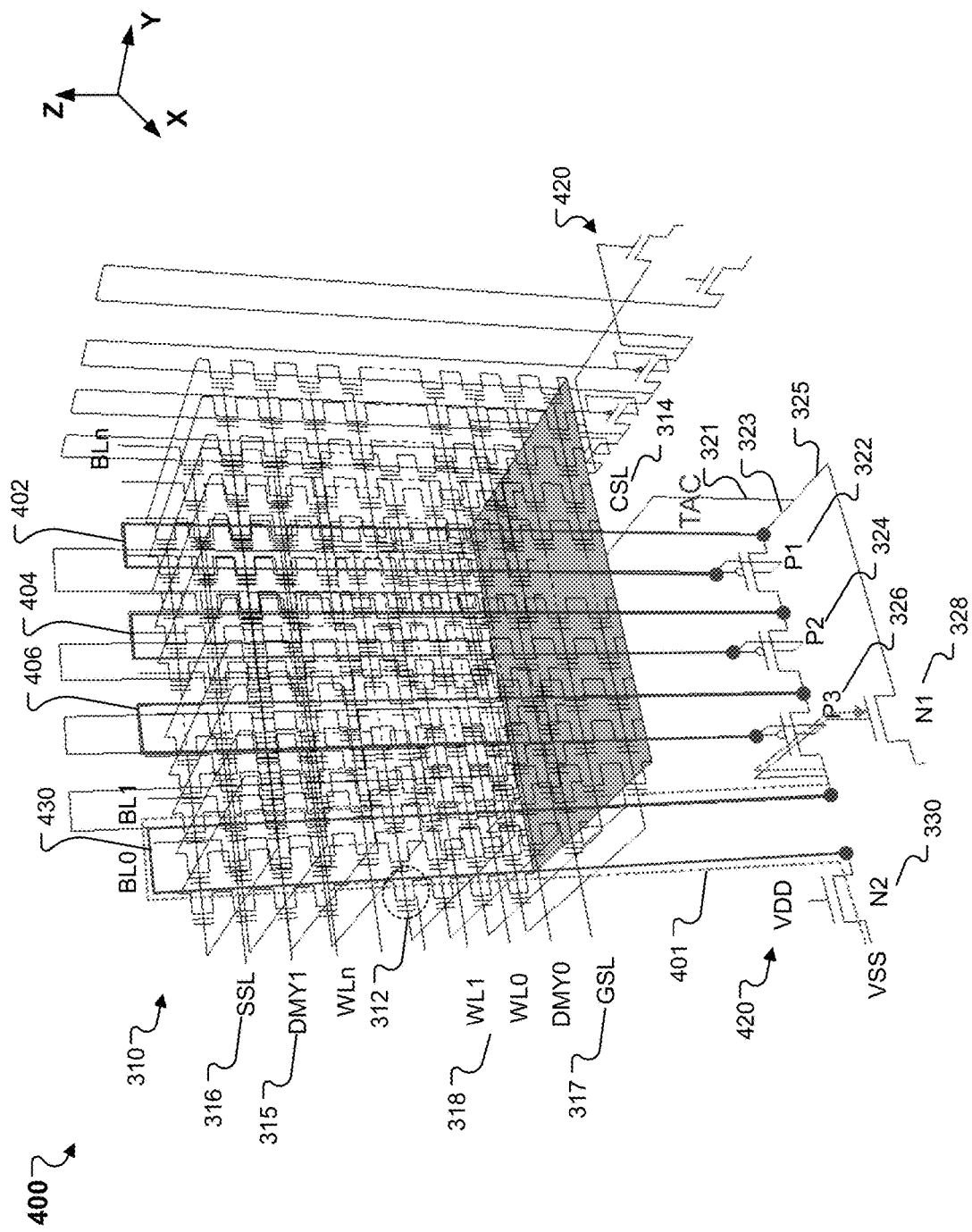
FIG. 4A illustrates an example 3D memory device after fabrication with disabled discharging circuits according to one or more embodiments of the present disclosure.
Figure 4B:
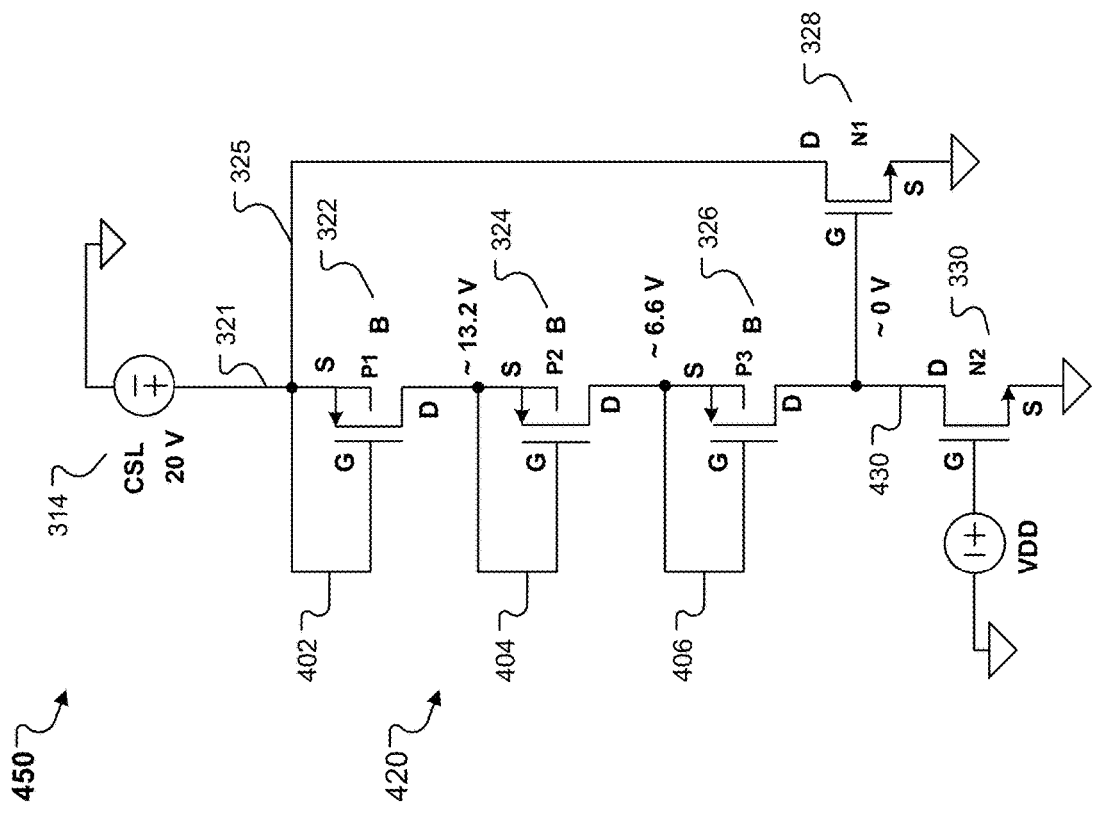
FIG. 4B is an equivalent circuit diagram of the disabled discharging circuit of FIG. 4A according to one or more embodiments of the present disclosure.

After the processing flow is completed, metallization wiring above the 3D memory can connect through-array contacts (TACs) to disable the discharging circuits without affecting internal circuits of the 3D memory, e.g., as described with further details in FIGS. 4A-4B. Each discharging circuit can include multiple p-type transistors (e.g., PMOS transistors) for discharging positive ions and at least one n-type transistor (e.g., NMOS transistor) for discharging negative electrons to the substrate at the same time. Because of the existence of the n-type transistor, a size (e.g., an area) of each p-type transistor can be significantly shrunk, which can make an overall area of the discharging circuits smaller. The multiple p-type transistors (e.g., two or more PMOS transistors) are coupled in series, which can avoid a high voltage applied on the 3D memory, e.g., during an erase operation.

Figure 2A:
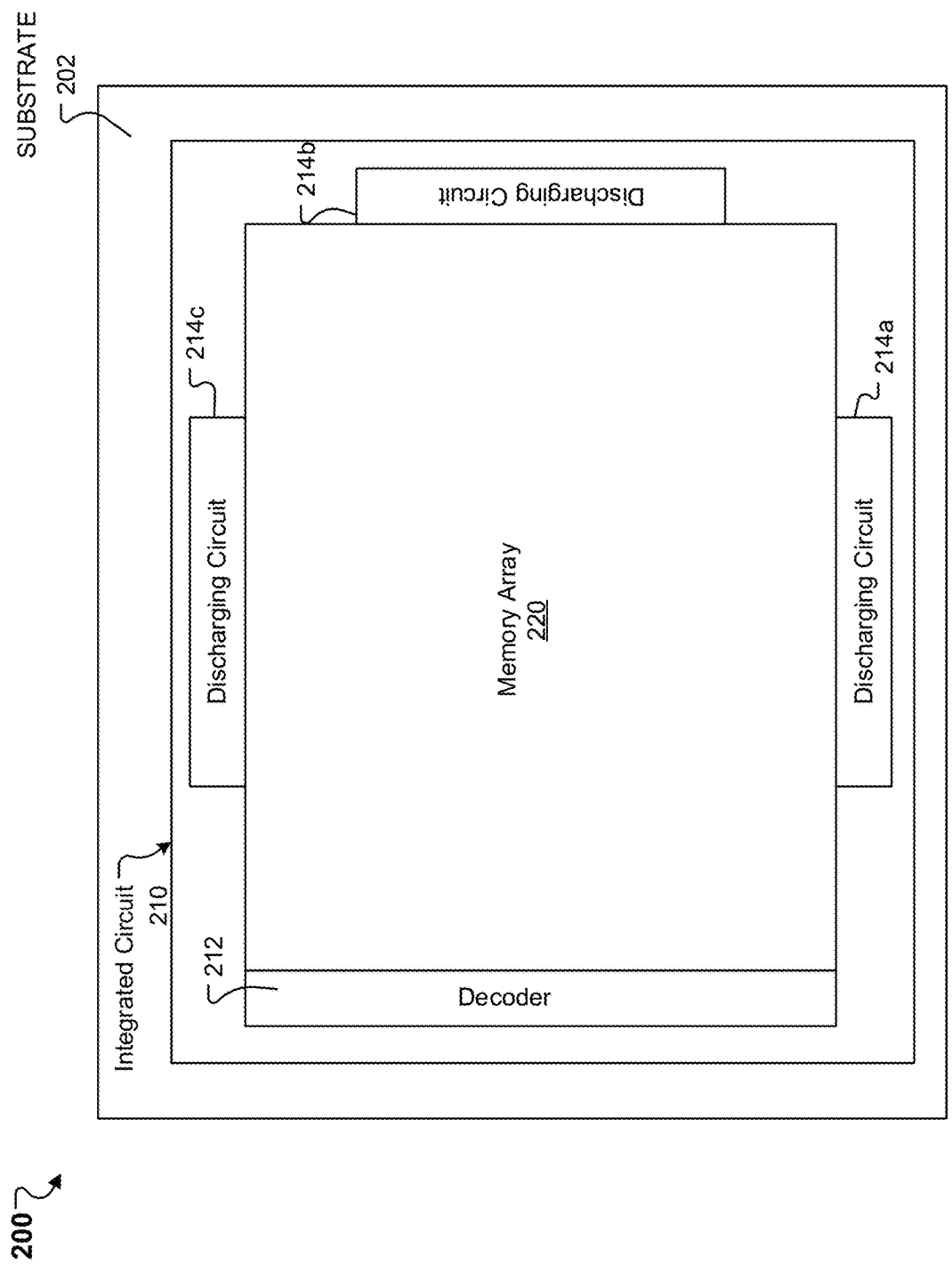
FIG. 2A illustrates a top view of an example 3D memory device with discharging circuits according to one or more embodiments of the present disclosure.
Figure 2B:
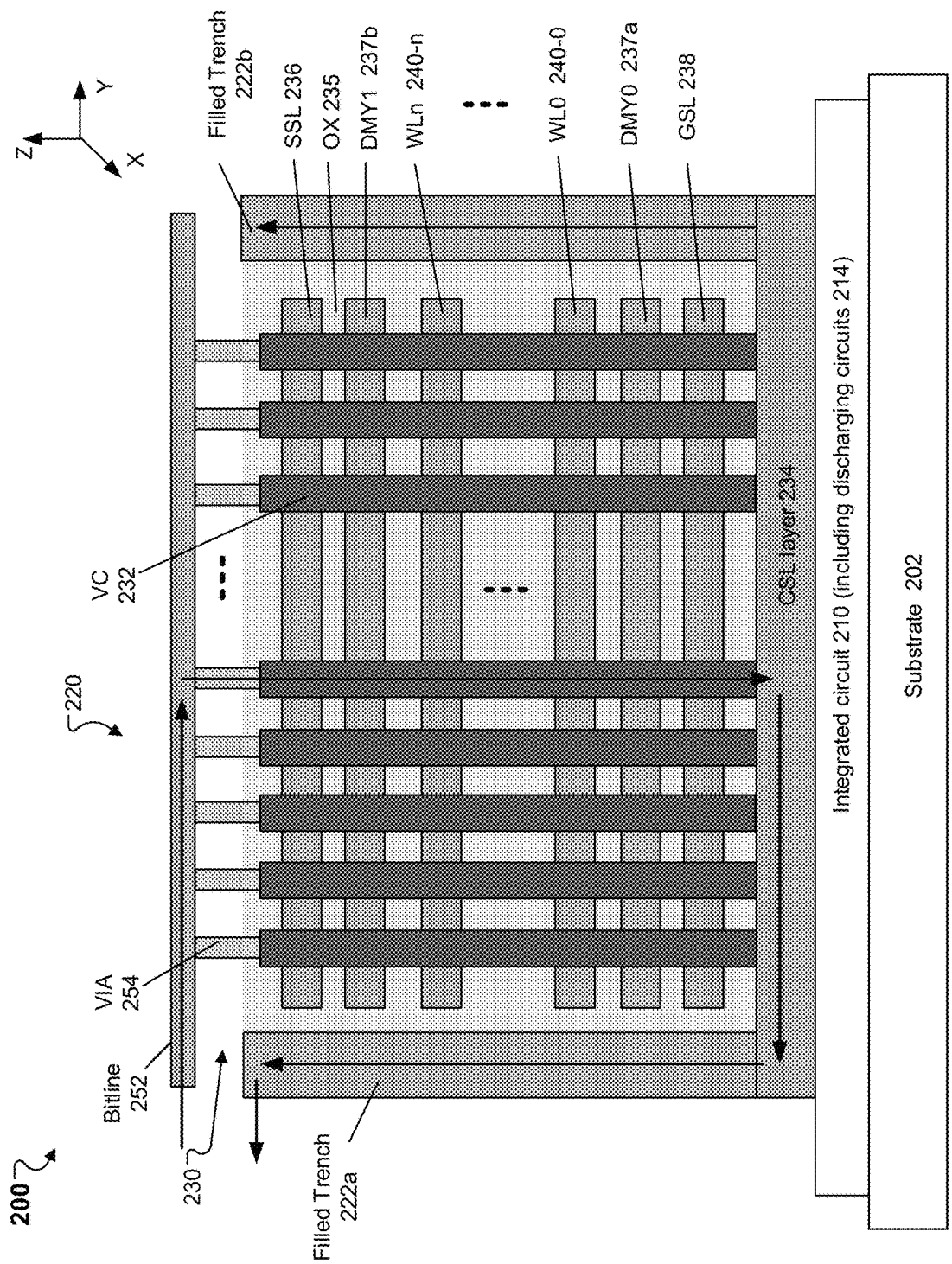
FIG. 2B illustrates a cross side view of the example 3D memory device of FIG. 2A according to one or more embodiments of the present disclosure.

FIGS. 2A-2B illustrate an example 3D memory device 200 according to one or more embodiments of the present disclosure. The 3D memory device 200 can be implemented as the memory 116 of FIG. 1A. The 3D memory device 200 can be formed by using a process illustrated in FIG. 5.

The memory device 200 can be formed on a substrate 202. The substrate 202 can include any underlying material or materials upon which a device, a circuit, an epitaxial layer, or a semiconductor may be formed. The substrate 202 can include layers that underlie a semiconductor device or even forms a base layer of a semiconductor device. The substrate can include one or any combination of silicon, germanium, silicon germanium, semiconductor compounds, or other semiconductor materials, and can include one or more regions that are p-doped, n-doped or undoped. For example, the substrate 202 can include a silicon substrate, e.g., a silicon wafer. The substrate 202 can include one or more doped regions, e.g., a p-type well region and an n-type well region.

The memory device 200 can include an integrated circuit 210 formed on the substrate 202. The integrated circuit 210 can include any circuits, chips, and/or semiconductor components for the memory device 200. In some implementations, the integrated circuit 210 includes a decoder 212, e.g., an X-decoder (or row decoder) and/or a Y-decoder (or column decoder). Each memory cell can be coupled to the X-decoder via a respective word line and coupled to the Y-decoder via a respective bit line. Accordingly, each memory cell can be selected by the X-decoder and the Y-decoder for read or write operations through the respective word line and the respective bit line. The integrated circuit 210 can also include at least one of an interface (e.g., for communication with a memory controller such as the device controller 112 of FIG. 1A), a data register, a data buffer, an address generator, a clock generator, a mode logic, a state machine, a sensor amplifier, or a high voltage (HV) generator.

The memory device 200 includes a memory array 220, e.g., having a 3D array of memory cells, formed on the integrated circuit 210. The memory array 220 can be conductively coupled to the integrated circuit 210. The memory array 220 can include a plurality of blocks. As illustrated in FIG. 2B, the memory array 220 can include a number of vertical channels (VCs) 232 formed between two adjacent filled trenches 222a, 222b (referred to generally as filled trenches 222 and individually as filled trench 222). The two adjacent filled trenches 222 can define a portion 230 of the memory array 220. The portion 230 can be a block, e.g., the block 150 of FIG. 1C.

Each VC 232 includes a string of memory cells, e.g., the cell string 144 of FIG. 1C or 154 of FIG. 1D, and is coupled to a corresponding bit line (BL) 252 through a corresponding conductive via 254. The VCs 232 and the filled trenches 222 in the portion 230 are conductively coupled to a common source line (CSL) layer 234 formed on the integrated circuit 210. Each portion can have a corresponding CSL layer. In some implementations, the CSL layer 234 includes multiple CSLs (e.g., the CSL 149 of FIG. 1B) that are conductively coupled to the VCs 232 and the filled trenches 222 and isolated by an isolating material. The CSL layer 234 can be coupled to the ground.

The VCs 232 extend through multiple alternating pairs of conductive layers and insulating layers 235 that can be made of a dielectric material, e.g., silicon oxide (or simplified as oxide or OX). The conductive layers can be made of a conductive material, e.g., a metal such as Tungsten (W). The conductive layers can form one more SSLs, e.g., SSL 236, one or more word lines (WLs), e.g., WL0 240-0, . . . , WLn 240-n (referred to generally as WLs 240 and individually as WL 240), and one or more GSLs 238. The conductive layers can also include one or more dummy (DMY) layers, e.g., DMY0 237a and DMY1 237b (referred to generally as DMYs 237 and individually as DMY 237). The conductive layers of the WLs 240 surround an external surface of the VC 232s acts as gates of the memory cells. As illustrated in FIG. 2B, in a read operation, selecting the SSL 236 allows the bit line 252 to select a VC 232 in the block 230. A read voltage from the bit line 252 goes into the selected VC 232 and the CSL layer 234 and then into the filled trench 222a that can be coupled to a periphery of the memory device 200, e.g., the memory interface in the integrated circuit 210.

As noted above, to form the memory array 220, one or more CSL layers 234 can be first formed on the integrated circuit 210 on the substrate 202. For example, a conductive layer can be first formed extending across the integrated circuit 210 and then patterned into individual CSL layers for corresponding portions or blocks. The individual CSL layers are isolated from each other. Then, multiple layers including a plurality of alternating pairs of two different dielectric layers, e.g., silicon oxide like OX 235 and silicon nitride (SIN), are formed on the one or more CSL layers 234. A plurality of vertical holes (or openings) through the multiple layers can be formed. The holes can be formed in a matrix or an array. The holes can be formed by anisotropic etching through the multiple layers along the vertical direction such as the Z direction, e.g., using reactive ion etching (RIE) or plasma etching, to the one or more CSL layers 234. Then the VCs 232 can be formed by filling in the holes. The holes can be filled with any one of an insulator/trapping or trapping/insulator combination, or any one of a poly only or poly/insulator combination. In some examples, the VC 232 include multiple layers oxide/nitride/oxide (ONO) formed on an internal surface of the hole and polysilicon filled in a middle of the hole. The filled materials in each VC can form a string of memory cells along the vertical direction. A bit line pad (BLP) can be formed on a top of the VC to seal the VC such that the interior of the VC is separated from an external environment during the following processing steps. The BLP is conductive and can be coupled to a bit line, e.g., the bit line 252 through a conductive VIA 254.

Then, source line trenches (SLTs) can be formed to separate the plurality of VCs 232 into multiple portions 230 (e.g., blocks). Two adjacent SLTs define a corresponding portion 230. After that, one type of dielectric layers, e.g., SIN, is selectively removed, e.g., by using wet etching with an etching solution such as $H_3PO_4$, and the other type of dielectric layers OX 235 and the VCs 232 remain. A conductive material (e.g., tungsten W) can be deposited to fill spaces left between the dielectric layers OX 235. The conductive material forms the conductive layers between adjacent dielectric layers OX 235. The conductive material can form a gate for the memory cell. The conductive layer can form a word line 240 connecting to the gates of the memory cells. The conductive material can also be formed on an internal surface of the SLTs to form the filled trenches 222. The filled trenches 222 can be isolated from the conductive layers, e.g., the SSL 236, the WLs 240, and the GSL 238, by an isolation material, e.g., OX.

As noted above, during etching the multiple dielectric layers (e.g., OX and SIN) to form the holes for the VCs 232, charges can accumulate in the holes along the vertical direction. To remove the accumulated charges during the etching process, as discussed with further details in FIGS. 3A-3C, one or more discharging circuits 214a, 214b, 214c (referred to generally as discharging circuits 214 and individually as discharging circuit 214) can be formed. The one or more discharging circuits 214 can be formed in the integrated circuit 210, e.g., before forming the memory array 220. The one or more discharging circuits 214 can be peripheral to the memory array 220. As illustrated in FIG. 2A, three discharging circuits 214a, 214b, 214c can be on a boundary of the memory array 220. Although three discharging circuits 214 are shown, one, two, four or more discharging circuits can be implemented for the memory array 220 in the memory device 200.

Each of the one or more discharging circuits 214 can be conductively coupled to one or more CSL layers 234 in the memory array 220. Each CSL layer 234 can be conductively coupled to multiple VCs 232 in a corresponding block, and can be conductively coupled to the one or more discharging circuits 214.

Figure 3A:
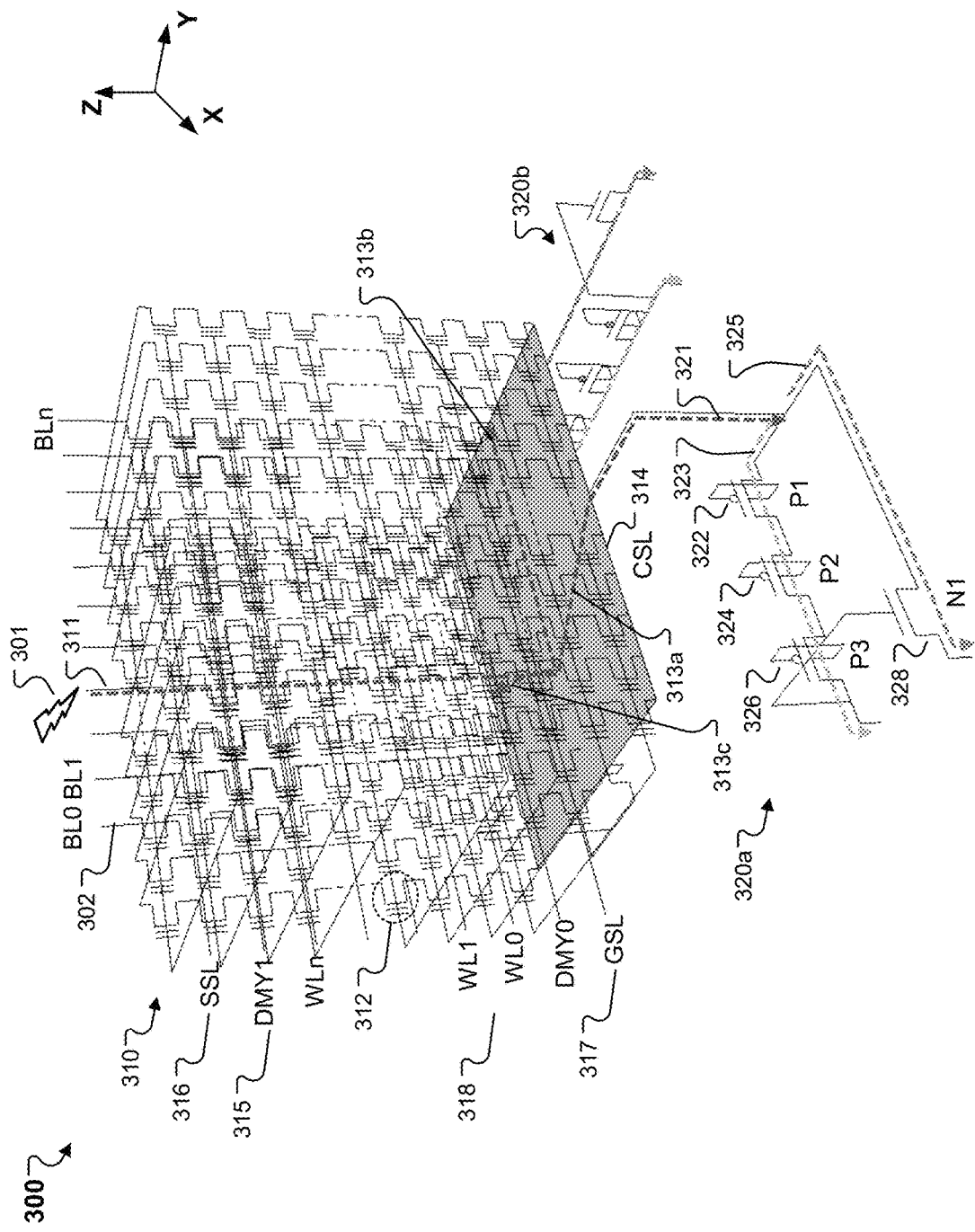
FIG. 3A illustrates an example semiconductor device with discharging circuits during fabricating a 3D memory device according to one or more embodiments of the present disclosure.
Figure 3B:
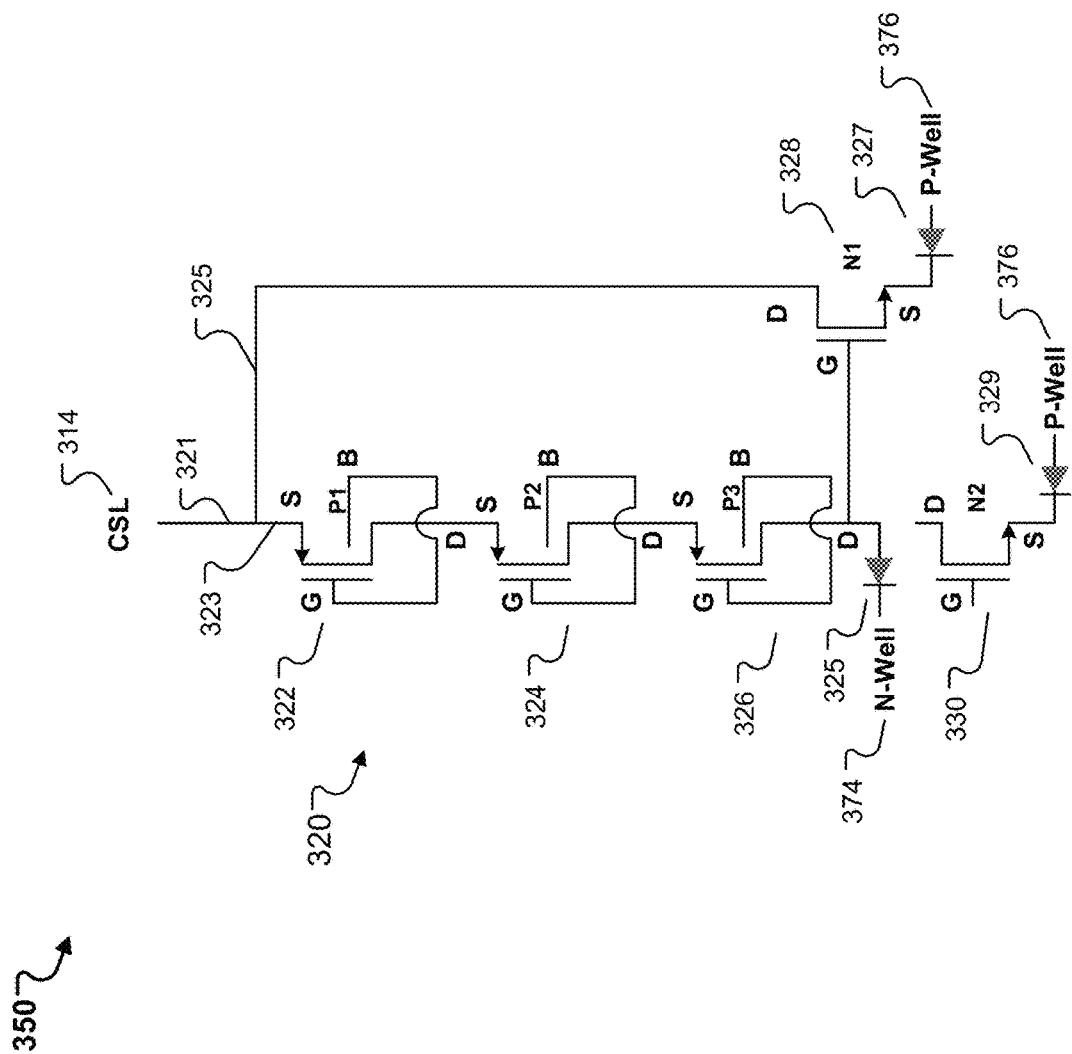
FIG. 3B is an equivalent circuit diagram of the discharging circuit of FIG. 3A according to one or more embodiments of the present disclosure.
Figure 3C:
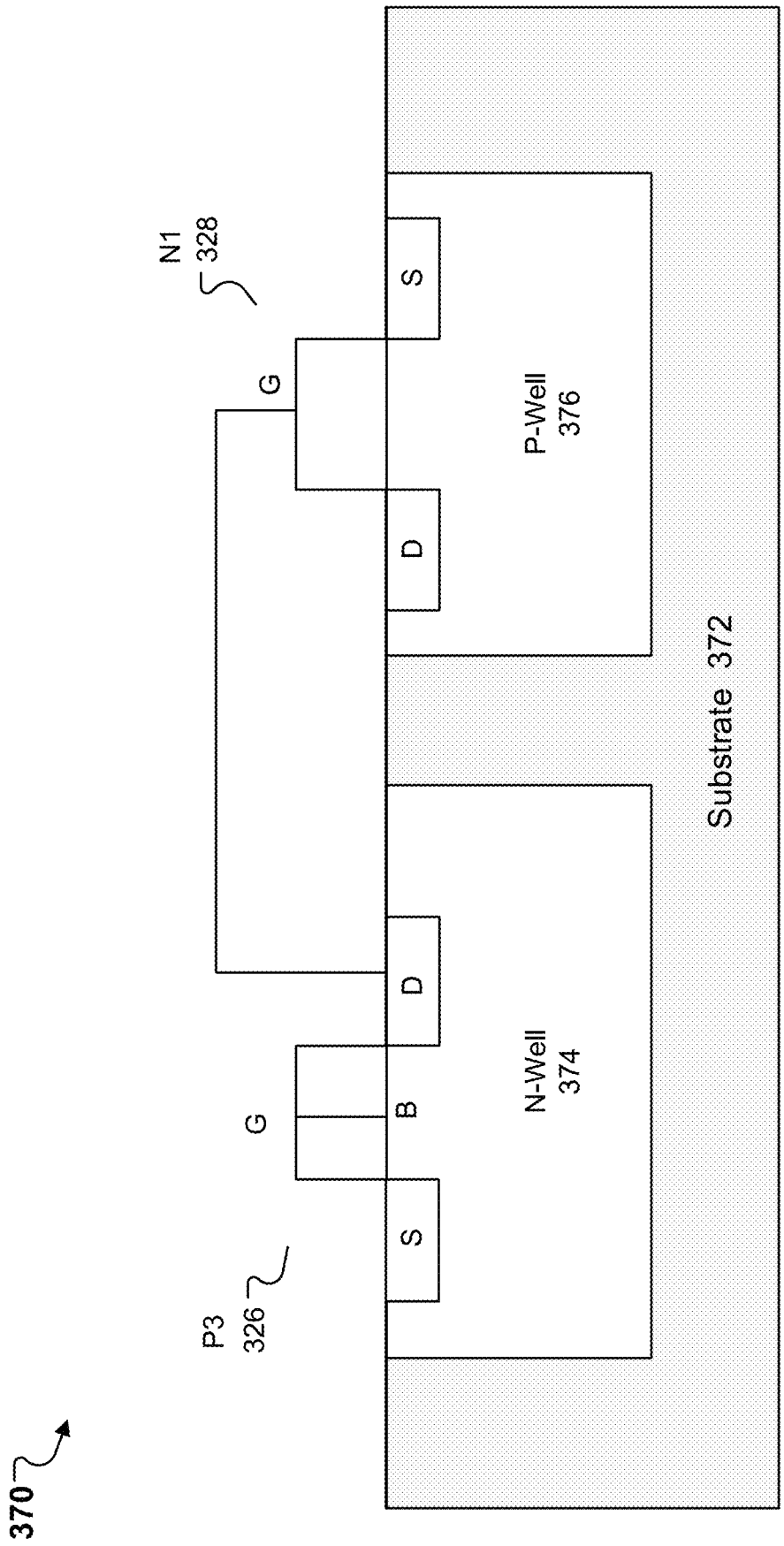
FIG. 3C is part of the equivalent circuit diagram of the discharging circuit according to one or more embodiments of the present disclosure.

FIGS. 3A-3C illustrate an example semiconductor device 300 during fabricating a 3D memory device according to one or more embodiments of the present disclosure. The 3D memory device can be the memory device 200 of FIGS. 2A-2B. The semiconductor device 300 can be an in-process device of the 3D memory device. The semiconductor device 300 can include one or more discharging circuits 320a, 320b, 320c (referred to generally as discharging circuits 320 and individually as discharging circuit 320). The discharging circuits 320 are configured to discharge in-process charges accumulated during the fabricating process to therefore avoid wafer arcing. The discharging circuits 320 can be implemented as the discharging circuits 214 of FIGS. 2A-2B.

The semiconductor device 300 can be formed on a substrate 372 (as illustrated in FIG. 3C), e.g., the substrate 202 of FIGS. 2A-2B. The semiconductor device 300 include a memory array that can include a number of blocks 310. The memory array can be similar to the memory array 220 of FIG. 2A. The block 310 can be similar to the portion 230 of FIG. 2B or the block 150 of FIG. 1C. Each block 310 can include a plurality of memory cells 312 (e.g., the memory cells 141 of FIG. 1B or 157 of FIG. 1C) arranged in a plurality of vertical channels 302. Each vertical channel 302 (e.g., the VC 232 of FIG. 2B) includes a string of memory cells that can be conductively coupled to a respective bit line BL0, BL1, . . . , or BLn, e.g., the bit line 252 of FIG. 2B.

Each VC 302 extends orthogonally through multiple layers in the block 310. The multiple layers can include alternating pairs of conductive layers and isolation layers. Each isolation layer, e.g., oxide layer OX 235 of FIG. 2B, can be between two adjacent conductive layers. The conductive layers can include an SSL 316 (e.g., the SSL 236 of FIG. 2B), a plurality of word lines WL0, WL1, . . . , WLn 318 (e.g., the word lines 240 of FIG. 2B), dummy layers 315 (e.g. the dummy layers 237 of FIG. 2B), and a GSL 317 (e.g., the GSL 238 of FIG. 2B).

The multiple layers are formed on a CSL layer 314 (e.g., the CSL layer 234 of FIG. 2B) in the block 310. Each VC 302 is conductively coupled to the CSL layer 314. The CSL layer 314 can be formed on an integrated circuit (e.g., the integrated circuit 210 of FIGS. 2A-2B) that is formed on the substrate. The discharging circuits 320 can be included in the integrated circuit. The CSL layer 314 can be conductively coupled to one or more discharging circuits 320 via conductive lines 321 for discharging charges 301. For example, as illustrated in FIG. 3A, charges 301 accumulated in a VC 302 along a conductive path 311 during processing the VCs 302 can flow to the CSL layer 314 and then to be discharged by the discharging circuits 320a, 320b, 320c through respective discharging paths 313a, 313b, 313c (referred to generally as discharging paths 313 and individually as discharging path 313). The conductive lines 321 can extend from the edges of the CSL layer 314 to carry charges laterally from the region below the memory array into the discharging circuits 320 at the edges of the memory array (e.g., as shown by the positions of the memory array 220 and discharging circuits 214a-214c in FIG. 2A).

Each discharging circuit 320 can be identical. Each discharging circuit 320 can include one or more transistors, e.g., one or more p-type transistors such as PMOS transistors and one or more n-type transistors such as NMOS transistors. As described with further details in FIGS. 4A-4B, two or more p-type transistors coupled in series can be implemented in the discharging circuit 320 to avoid breakdown during a normal operation (e.g., an erase operation) of the 3D memory device.

In some examples, as illustrated in FIGS. 3A-3B, each discharging circuit 320 includes three p-type transistors (P1, P2, P3) 322, 324, 326 and an n-type transistor (N1) 328. The p-type transistors 322, 324, 326 are coupled in series and configured to discharge ions flowing through a conductive path 323 from a conductive line 321 that is coupled to the CSL layer 314. The n-type transistor 328 is configured to discharge electrons flowing through a conductive path 325 from the CSL layer 314 through the conductive line 321. The n-type transistor 328 can be also coupled to the p-type transistor 326. Thus, the accumulated charges can be discharged by the p-type transistors 322, 324, 326 through the conductive path 323 and the n-type transistor 328 through the conductive path 325, e.g., at the same time or simultaneously. Accordingly, the accumulated discharges can be discharged more efficiently and quickly than without the n-type transistor 328. Additionally, with the existence of the n-type transistor 328 to discharge the electrons, a size of each p-type transistor 322, 324, 326 can be made smaller, which can reduce an overall area of the discharging circuits 320 in the 3D memory device.

FIG. 3B shows an equivalent circuit diagram 350 of the discharging circuit 320 of FIG. 3A, and FIG. 3C shows part of the equivalent circuit diagram 370. Each p-type transistor can be a floating transistor, and can include a gate terminal (G), a source terminal (S), a drain terminal (D), and a bulk terminal (B). The substrate 372 can include an n-type well region (or N-Well) 374 and a p-type well region (or P-Well) 376. The p-type transistors 322, 324, 326 and the n-type transistor 328 can be at least partially formed in the substrate 372, e.g., respectively in the n-type well region 374 and in the p-type well region 376. For example, drain and source terminals of the p-type transistors 322, 324, 326 can be formed in the n-type well region 374, and drain and source terminals of the n-type transistor 328 can be formed in the p-type well region 376.

Referring to FIG. 3B, the source terminal of the beginning p-type transistor, e.g., the p-type transistor 322, is coupled to the CSL layer 314 through the conductive path 323. Adjacent p-type transistors are coupled together by connecting the drain terminal of the preceding p-type transistor with the source terminal of the following p-type transistor. A drain terminal of the n-type transistor 328 is coupled to the CSL layer 314 through the conductive path 325. A gate terminal of the n-type transistor 328 is coupled to the drain terminal of the ending p-type transistor, e.g., the p-type transistor 326.

The gate terminal (G) and the bulk terminal (B) of each p-type transistor 322, 324, 326 can be conductively coupled together, such that the beginning p-type transistor 322 can be turned on when the accumulated charges generate a voltage Vgs higher than a threshold voltage Vt of the p-type transistor. For example, the threshold voltage Vt can be about 1 V. After the p-type transistor 322 is turned on, the following p-type transistors 324, 326 can be sequentially turned on to discharge ions to the n-type well region 374 in the substrate 372. A diode (or a p-n junction) 325 can be formed between the n-type well region 374 and the p-type transistor 326.

As the drain terminal of the p-type transistor 326 is coupled to the gate terminal of the n-type transistor 328, after the p-type transistor 326 is turned on, the n-type transistor 328 can be turned on to discharge electrons to the p-type well region 376 in the substrate 372. A diode (or a p-n junction) 327 can be formed between the p-type well region 376 and the n-type transistor 328.

The discharging circuit 320 can include a second n-type transistor (N2) 330. As discussed with further details below, the second n-type transistor 330 is configured to disable the n-type transistor 328 when the 3D memory device is about to be completed, e.g., when the memory array is completed. The second n-type transistor 330 can be formed together with the other transistors in the discharging circuit, e.g., the p-type transistors 322, 324, 326 and the n-type transistor 328. However, before the memory array is completed and during processing the semiconductor device 300, as illustrated in FIG. 3B, gate and drain terminals of the second n-type transistor 330 are not coupled to the n-type transistor 328. The source terminal of the second n-type transistor 330 can be in the p-type well region 376, and a diode (or a p-n junction) 329 can be formed between the p-type well region 376 and the second n-type transistor 330.

FIG. 4A illustrates an example 3D memory device 400 with disabled discharging circuits, and FIG. 4B is an equivalent circuit diagram 450 of the disabled discharging circuit of FIG. 4A. The 3D memory device 400 can be a final product of the semiconductor device 300 of FIG. 3A. The 3D memory device 400 can be the memory device 200 of FIGS. 2A-2B and can be implemented as the memory 116 of FIG. 1A.

After a memory array (e.g., the memory array 220 of FIG. 2A) of the 3D memory device 400 is completed, the discharging circuit 320 can be disabled to become disabled discharging circuits 420. In some implementations, the source terminal and the gate terminal of each of the plurality of p-type transistors 322, 324, 326 can be conductively coupled by formation of a corresponding first conductive line 402, 404, 406 through the memory array to disable the p-type transistor 322, 324, 326. Each first conductive line 402, 404, 406 can include a through-array-contact (TAC) through the memory array and metal wiring on top of the memory array. As the source terminal, the gate terminal, and the bulk terminal of each p-type transistor 322, 324, 326 are connected, the p-type transistor 322, 324, 326 is disabled and its function as a discharging circuit stops working.

In some implementations, the n-type transistor 328 is disabled by conductively coupling to a ground or a negative voltage by a second conductive line 430 through the memory array. The second conductive line 430 can also include a through-array-contact (TAC) through the memory array and metal wiring on top of the memory array. As illustrated in FIGS. 4A-4B, the n-type transistor 328 can be coupled to the second n-type transistor 330 by the second conductive line 430. A gate terminal of the second n-type transistor 330 is coupled to a positive voltage VDD, and a source terminal of the second n-type transistor 330 is coupled to the ground or the negative voltage VSS. A drain terminal of the second n-type transistor 330 is conductively coupled to the gate terminal of the n-type transistor 328 through the second conductive line 430. Thus, the second n-type transistor 330 can pass the ground or the negative voltage through the second conductive line 430 to the gate of the n-type transistor 328 to close the n-type transistor 328.

As the drain terminal of the p-type transistor 326 is coupled to the gate terminal of the n-type transistor 328, the drain terminal of the p-type transistor 326 is also coupled to the ground or the negative voltage. Accordingly, when a voltage from the CSL layer 314 is applied, e.g., during an erase operation on the 3D memory device 400, the voltage can be distributed among the p-type transistors. If the p-type transistors are identical, the voltage can be evenly distributed. For example, as illustrated in FIG. 4B, when the voltage applied on the CSL layer 314 is about 20 Volts (Vs), each p-type transistor is just held with one third of the voltage, e.g., 6.6 V, much smaller than the voltage. Although a p-type transistor in the discharging circuit 420 is disabled and does not work, the p-type transistor may suffer from a high voltage applied on the CSL layer 314 during a normal erase operation on the memory array. Thus, coupling two or more p-type transistors, e.g., the p-type transistors 322, 324, 326, in series can avoid breakdown of the p-type transistors. An n-type transistor can have a higher breakdown voltage than a p-type transistor. Thus, one n-type transistor 328 can be implemented in the conductive path 325. In some implementations, two or more n-type transistors can be also used in the conductive path 325 if the voltage applied in the CSL layer 314 is high.

Figure 5:
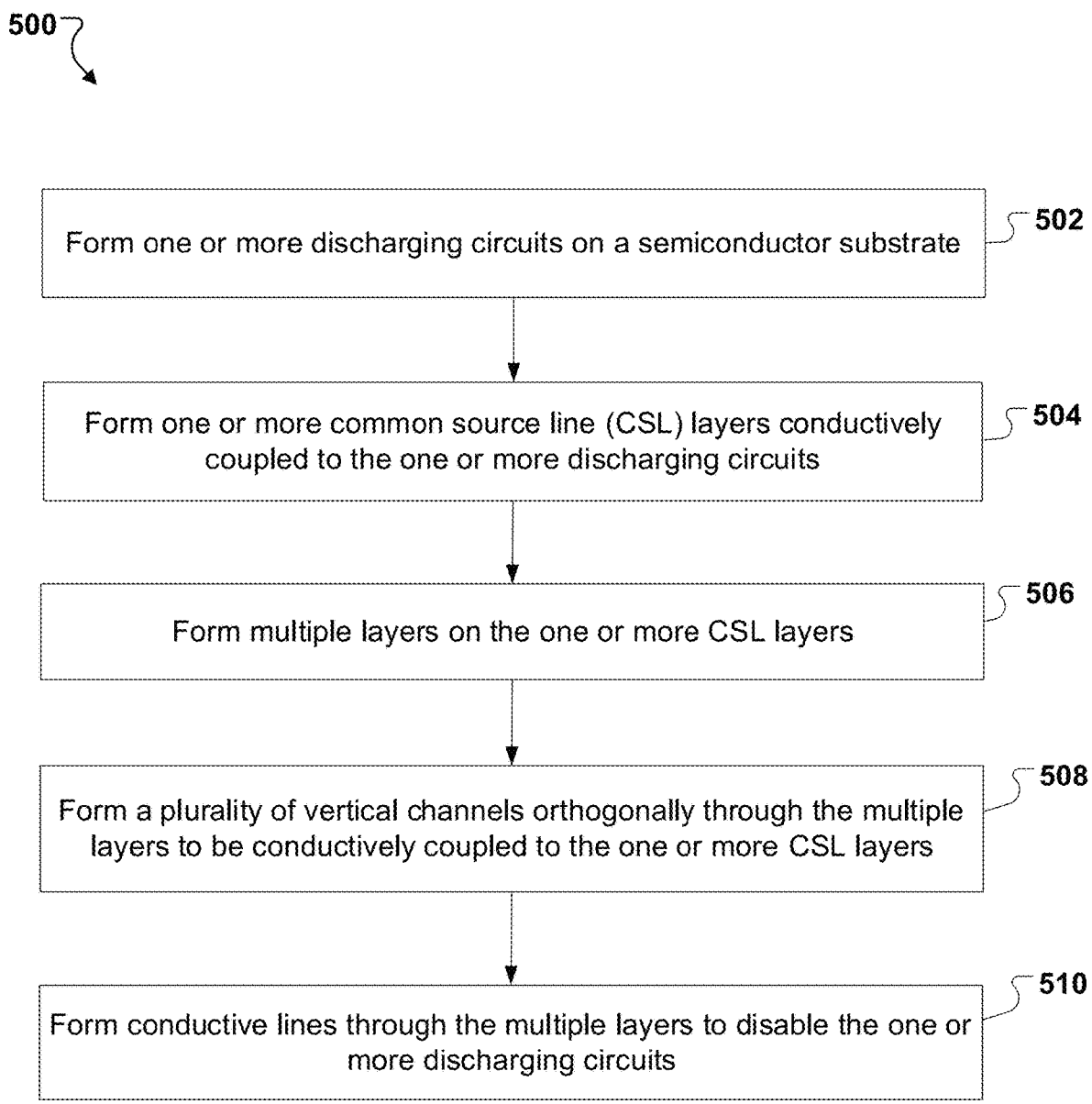
FIG. 5 is a flow chart of a process of forming a semiconductor device with one or more discharging circuits according to one or more embodiments of the present disclosure.

FIG. 5 is a flow chart of a process 500 of forming a semiconductor device with one or more discharging circuits according to one or more embodiments of the present disclosure. The semiconductor device can be the memory 116 of FIG. 1A, the 3D memory device 200 of FIGS. 2A-2B, the semiconductor device 300 of FIGS. 3A-3C, or the 3D memory device 400 of FIGS. 4A-4B. The semiconductor device can include a memory array, e.g., the memory array 220 of FIG. 2A-2B. The one or more discharging circuits can be the discharging circuits 214 of FIGS. 2A-2B, 320 of FIGS. 3A-3B, or 420 of FIGS. 4A-4B.

At 502, one or more discharging circuits are formed on a semiconductor substrate. The semiconductor substrate can be the substrate 202 of FIGS. 2A-2B or the substrate 372 of FIG. 3C. As the memory array is to be formed in a central region, and the one or more discharging circuits can be arranged on peripheral regions of the semiconductor substrate, e.g., as illustrated in FIG. 2A. An integrated circuit (e.g., the integrated circuit 210 of FIGS. 2A-2B) can be formed on the semiconductor substrate, and the integrated circuit can include the one or more discharging circuits and one or more other circuits, semiconductor components, or chips. The integrated circuit can be formed as part of the same process steps that fabricate the discharging circuits.

Each of the one or more discharging circuits can include a plurality of p-type transistors (e.g., the p-type transistors 322, 324, 326 of FIGS. 3A-3C and 4A-4B) coupled in series and an n-type transistor (e.g., the n-type transistor 328 of FIGS. 3A-3C and 4A-4B) coupled to the plurality of p-type transistors. Bulk and gate terminals of each of the plurality of p-type transistors can be coupled together. A source terminal of a beginning p-type transistor (e.g., the p-type transistor 322) among the plurality of p-type transistors and a drain terminal of the n-type transistor can be coupled together. A drain terminal of an ending p-type transistor (e.g., the p-type transistor 326) among the plurality of p-type transistors can be coupled to a gate terminal of the n-type transistor. For adjacent first and second p-type transistors, the drain terminal of the first p-type transistor is coupled to the source terminal of the second p-type transistor immediately after the first p-type transistor among the plurality of p-type transistors.

The semiconductor substrate can include an n-type well region, e.g., the n-type well region 374 of FIG. 3C, and a p-type well region, e.g., the p-type well region 376 of FIG. 3C. Forming the one or more discharging circuits on the semiconductor substrate can include forming the drain terminal of the ending p-type transistor in the n-type well region and the source terminal of the n-type transistor in the p-type well region. In some embodiments, each of the plurality of p-type transistors and the n-type transistor can be at least partially in the n-type well region and the p-type well region, respectively. For example, the source and drain terminals of the plurality of p-type transistors can be formed in the n-type well region, and the source and drain terminals of n-type transistor can be formed in the p-type well region.

At 504, one or more common source line (CSL) layers are formed to be conductively coupled to the one or more discharging circuits. The one or more CSL layers can be formed on the integrated circuit, e.g., as illustrated in FIGS. 2A-2B. Each CSL layer can be the CSL layer 160 of FIG. 1C, the CSL layer of FIG. 2B, the CSL layer of FIGS. 3A-3B, or the CSL layer of FIGS. 4A-4B. Each CSL layer is conductively coupled to the one or more discharging circuits, e.g., as illustrated in FIG. 3A.

At 506, multiple layers are formed on the one more CSL layers. The multiple layers can include a plurality of alternating pairs of dielectric or isolation layers, e.g., OX and SIN. At 508, a plurality of vertical channels (VCs) are formed to be orthogonally through the multiple layers to be conductively coupled to the one or more CSL layers. To form the VCs, a plurality of vertical holes (or openings) through the multiple layers can be first formed, e.g., by anisotropic etching through the multiple layers along the vertical direction to the one or more CSL layers. The etching can be performed by reactive ion etching (RIE) or plasma etching. Then the VCs can be formed by filling in the holes with any one of an insulator/trapping or trapping/insulator combination, or any one of a poly only or poly/insulator combination. A VC with the filled materials can form a string of memory cells along the vertical direction.

During the etching process step (and/or any other following process steps), charges can be accumulated in the VCs along the vertical direction, which can be discharged through the one or more discharging circuits to the semiconductor substrate, e.g., as illustrated in FIGS. 3A and 3B. In some implementations, as illustrated in FIGS. 3B and 3C, ions are discharged through the p-type transistors into the n-type well region in the semiconductor substrate, and electrons are discharged through the n-type transistor into the p-type well region in the semiconductor substrate. In such a way, wafer arching or plasma damage phenomenon can be avoided or eliminated. Meanwhile, as the n-type transistor can discharge the electrons, the discharging speed can be increased. Also with the existence of the n-type transistor, a size (e.g., an area) of the p-type transistors can be made smaller to thereby reduce an overall area of the one or more discharging circuits and the overall area of the semiconductor device.

In some implementations, in the following process steps, one type of the dielectric layers, e.g., SIN, is etched and replaced with a conductive material, e.g., a metal. The plurality of VCs can be separated by multiple filled trenches. Each two adjacent filled trenches define a respective block. Each block can include conductive layers (made of the conductive material) separated from each other by insulating layers (the other type of dielectric layers such as OX), and vertical channels orthogonally through the conductive layers and the insulating layers. The vertical channels and the two adjacent filled trenches are coupled to a corresponding CSL for the block. Each page of memory cells can be coupled to a respective word line (e.g., the WL 240 of FIG. 2B or the WL 318 of FIG. 3A or FIG. 4A), and each string of memory cells can be conductively coupled to a respective bit line (e.g., the BL 252 of FIG. 2B).

At 510, after the semiconductor device is close to complete, conductive lines through the multiple layers are formed to disable the one or more discharging circuits, as illustrated in FIGS. 4A-4B. For example, the conductive lines can be formed after the memory array is completed, e.g., when there are one or more top layers or metal wiring left to be completed on the memory array. The conductive lines can include through-array-contacts (TACs) and metal wiring on the one or more top layers connecting the TACs.

To disable each p-type transistor, a corresponding conductive line, e.g., the first conductive line 402, 404, 406 of FIGS. 4A-4B, can be formed to connect the gate terminal and the source terminal of the p-type transistor such that the gate, source and bulk terminals are all connected together to close the function of the p-type transistor.

To disable the n-type transistor, each discharging circuit can include a second n-type transistor, e.g., the second n-type transistor 330 of FIGS. 4A-4B. The second n-type transistor can be formed at step 502, together with the other p-type and n-type transistors, e.g., as illustrated in FIGS. 3A-3B, but the second n-type transistor is not coupled to the other p-type and n-type transistors at that time.

At step 510, a corresponding conductive line, e.g., the second conductive line 430 of FIGS. 4A-4B, can be formed to connect a drain terminal of the second n-type transistor to the gate terminal of the n-type transistor, while a gate terminal of the second n-type transistor is coupled to a positive voltage VDD and a source terminal of the second n-type transistor is coupled to a ground or a negative voltage VSS. Thus, the second n-type transistor can pass the ground or the negative voltage through the conductive line to the gate of the n-type transistor to close the n-type transistor. Meanwhile, as the drain terminal of the ending p-type transistor, e.g., the p-type transistor 326 of FIGS. 4A-4B, is coupled to the gate terminal of the n-type transistor, the drain terminal of the p-type transistor is also coupled to the ground or the negative voltage. Accordingly, when a voltage from the CSL layer 314 is applied during an erase operation on the semiconductor device (e.g., a 3D memory device), the voltage can be, e.g., evenly, distributed among the p-type transistors coupled in series. In such a way, the p-type transistors can avoid breakdown during the erase operation.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A semiconductor device comprising:
a semiconductor substrate;
one or more discharging circuits arranged on the semiconductor substrate;
one or more common source line (CSL) layers connected to the one or more discharging circuits via one or more connection lines; and
a memory array having a three-dimensional (3D) array of memory cells arranged in a plurality of vertical channels on the one or more CSL layers, each of the plurality of vertical channels comprising a respective string of memory cells, each of the one or more CSL layers being conductively coupled to corresponding strings of memory cells, wherein each of the one or more discharging circuits comprises one or more transistors that are configured to:
be enabled to discharge charges accumulated during forming the plurality of vertical channels, and
be disabled by one or more corresponding conductive lines through the memory array after the plurality of vertical channels is formed.

2. The semiconductor device of claim 1, wherein the one or more transistors comprise:
one or more p-type transistors, wherein gate and source terminals of each of the one or more p-type transistors are conductively coupled together by a corresponding first conductive line through the memory array to disable the p-type transistor; and
an n-type transistor having a gate terminal conductively coupled to a ground or a negative voltage by a second conductive line through the memory array to disable the n-type transistor.

3. The semiconductor device of claim 2, wherein each of the one or more discharging circuits further comprises a second n-type transistor having:
a drain terminal conductively coupled to the gate terminal of the n-type transistor through the second conductive line;
a gate terminal coupled to a positive voltage; and
a source terminal coupled to the ground or the negative voltage.

4. The semiconductor device of claim 2, wherein the one or more p-type transistors comprise:
a plurality of p-type transistors coupled in series, the gate terminal of each of the plurality of p-type transistors being coupled to a bulk terminal of the p-type transistor,
wherein a beginning p-type transistor among the plurality of p-type transistors has a source terminal coupled to a corresponding CSL layer of the one or more CSL layers, and an ending p-type transistor among the plurality of p-type transistors has a drain terminal coupled to the gate terminal of the n-type transistor, and
wherein a drain terminal of the n-type transistor is coupled to the corresponding CSL layer.

5. The semiconductor device of claim 4, wherein a drain terminal of a first p-type transistor is coupled to a source terminal of a second p-type transistor immediately after the first p-type transistor among the plurality of p-type transistors.

6. The semiconductor device of claim 4, wherein the semiconductor substrate comprises an n-type well region and p-type well region, and
wherein the drain terminal of the ending p-type transistor is in the n-type well region, and the source terminal of the n-type transistor is in the p-type well region.

7. The semiconductor device of claim 1, wherein the one or more discharging circuits are peripheral to the memory array on the semiconductor substrate.

8. The semiconductor device of claim 1, comprising an integrated circuit on the semiconductor substrate, the integrated circuit comprising the one or more discharging circuits,
wherein the one more CSL layers are arranged on top of the integrated circuit.

9. The semiconductor device of claim 1, wherein the memory array comprises a plurality of blocks separated by multiple filled trenches, each of the plurality of blocks being between two adjacent filled trenches and comprising:
conductive layers separated from each other by insulating layers; and
vertical channels orthogonally through the conductive layers and the insulating layers,
wherein the vertical channels and the two adjacent filled trenches are coupled to a corresponding CSL layer for the block, and
wherein each page of memory cells is coupled to a respective word line, and each string of memory cells is conductively coupled to a respective bit line.

10. A semiconductor device comprising:
a semiconductor substrate;
one or more discharging circuits arranged on the semiconductor substrate;
one or more common source line (CSL) layers connected to the one or more discharging circuits via one or more connection lines; and
a plurality of vertical channels extending through multiple layers and arranged on the one or more CSL layers, each of the one or more CSL layers being conductively coupled to corresponding vertical channels of the plurality of vertical channels,
wherein each of the one or more discharging circuits comprises
a plurality of p-type transistors coupled in series to a corresponding CSL layer of the one or more CSL layers, each of the plurality of p-type transistors having bulk and gate terminals that are coupled together, and
an n-type transistor having a drain terminal coupled to the corresponding CSL layer,
wherein a beginning p-type transistor among the plurality of p-type transistors has a source terminal coupled to the corresponding CSL layer, and an ending p-type transistor among the plurality of p-type transistors has a drain terminal coupled to a gate terminal of the n-type transistor, and
wherein each of the one or more discharging circuits is configured to:
be enabled to discharge charges accumulated during forming the plurality of vertical channels, and
be disabled after the plurality of vertical channels is formed.

11. The semiconductor device of claim 10, wherein a source terminal and the gate terminal of each of the plurality of p-type transistors are conductively coupled by a corresponding first conductive line through the multiple layers to disable the p-type transistor; and
wherein the gate terminal of the n-type transistor is conductively coupled to a ground or a negative voltage by a second conductive line through the multiple layers to disable the n-type transistor.

12. The semiconductor device of claim 11, wherein each of the one or more discharging circuits further comprises a second n-type transistor having:
a drain terminal conductively coupled to the gate terminal of the n-type transistor through the second conductive line;
a gate terminal coupled to a positive voltage; and
a source terminal coupled to the ground or the negative voltage.

13. The semiconductor device of claim 10, wherein the semiconductor substrate comprises a n-type well region and p-type well region, and wherein the drain terminal of the ending p-type transistor is in the n-type well region, and a source terminal of the n-type transistor is in the p-type well region.

14. The semiconductor device of claim 10, wherein the one or more discharging circuits are peripheral to the multiple layers on the semiconductor substrate.

15. The semiconductor device of claim 10, comprising:

a memory array having a three-dimensional (3D) array of memory cells arranged in the plurality of vertical channels, each of the plurality of vertical channels comprising a respective string of memory cells, each of the one or more CSL layers being conductively coupled to corresponding strings of memory cells, wherein the memory array comprises a plurality of blocks separated by multiple filled trenches, each of the plurality of blocks being between two adjacent filled trenches, wherein the vertical channels and the two adjacent filled trenches are coupled to a corresponding CSL layer for the block, and wherein each page of memory cells is coupled to a respective word line, and each string of memory cells is conductively coupled to a respective bit line.

16. A method of forming a semiconductor device, the method comprising:

forming one or more discharging circuits on a semiconductor substrate, each of the one or more discharging circuit comprising one or more transistors;

forming one or more common source line (CSL) layers conductively coupled to the one or more discharging circuits;

forming a plurality of vertical channels orthogonally through multiple layers on the one or more CSL layers to be conductively coupled to the one or more CSL layers, wherein each of the one or more CSL layers is configured to be conductively coupled to corresponding vertical channels of the plurality of vertical channels, such that the one or more discharging circuits discharge charges generated in the corresponding vertical channels; and after forming the plurality of vertical channels, forming one or more conductive lines through the multiple layers to disable the one or more discharging circuits.

17. The method of claim 16, wherein the one or more transistors comprise:

multiple p-type transistors coupled in series, and an n-type transistor, wherein bulk and gate terminals of each of the multiple p-type transistors are coupled together, wherein a source terminal of a beginning p-type transistor among the multiple p-type transistors and a drain terminal of the n-type transistor are coupled to a corresponding CSL layer of the one or more CSL layers, and wherein a drain terminal of an ending p-type transistor among the multiple p-type transistors is coupled to a gate terminal of the n-type transistor.

18. The method of claim 17, wherein forming conductive lines through the multiple layers to disable the one or more discharging circuits comprises:

forming a corresponding first conductive line through the multiple layers to couple together the gate and source terminals of each of the multiple p-type transistors to disable the p-type transistor; and forming a second conductive line through the multiple layers to couple the n-type transistor to a ground or a negative voltage to disable the n-type transistor.

19. The method of claim 18, wherein each of the one or more discharging circuits comprises a second n-type transistor having:

a gate terminal coupled to a positive voltage;

a source terminal coupled to the ground or the negative voltage; and a drain terminal, wherein forming the second conductive line through the multiple layers to couple the n-type transistor to the ground or the negative voltage comprises:

forming the second conductive line to conductively couple the drain terminal of the second n-type transistor to the gate terminal of the n-type transistor.

20. The method of claim 17, wherein the semiconductor substrate comprises a n-type well region and p-type well region, and wherein forming the one or more discharging circuits on the semiconductor substrate comprises:

forming the drain terminal of the ending p-type transistor is in the n-type well region and the source terminal of the n-type transistor is in the p-type well region.

* * * * *